(12) United States Patent
Arellano et al.

(10) Patent No.: US 11,069,601 B2
(45) Date of Patent: Jul. 20, 2021

(54) LEADLESS SEMICONDUCTOR PACKAGE WITH WETTABLE FLANKS

(71) Applicant: STMicroelectronics, Inc., Calamba (PH)

(72) Inventors: Ian Harvey Arellano, Bauang (PH); Aaron Cadag, Calamba (PH); Ela Mia Cadag, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 28 days.

(21) Appl. No.: 16/264,822

(22) Filed: Feb. 1, 2019

(65) Prior Publication Data

US 2019/0267311 A1 Aug. 29, 2019

Related U.S. Application Data

(60) Provisional application No. 62/635,872, filed on Feb. 27, 2018.

(51) Int. Cl.
*H01L 23/495* (2006.01)
*H01L 23/00* (2006.01)
(Continued)

(52) U.S. Cl.
CPC .... *H01L 23/49541* (2013.01); *H01L 23/3121* (2013.01); *H01L 23/49503* (2013.01); *H01L 23/49513* (2013.01); *H01L 23/49575* (2013.01); *H01L 24/45* (2013.01); *H01L 24/48* (2013.01); *H01L 21/4821* (2013.01); *H01L 21/561* (2013.01); *H01L 21/565* (2013.01); *H01L 24/32* (2013.01); *H01L 24/73* (2013.01);
(Continued)

(58) Field of Classification Search
CPC ......... H01L 23/49541; H01L 23/49503; H01L 24/48; H01L 23/3121; H01L 21/4821; H01L 24/32; H01L 24/73; H01L 2224/32245; H01L 2224/73265; H01L 2224/48091; H01L 2224/48106; H01L 2224/48245; H01L 24/97; H01L 24/83; H01L 24/85; H01L 24/92; H01L 21/561; H01L 21/565; H01L 2224/92247; H01L 2224/97; H01L 2224/2919; H01L 24/29; H01L 2224/48247; H01L 21/4828; H01L 23/49582; H01L 23/49548; H01L 2924/181; H01L 23/3107; H01L 24/45; H01L 21/568; H01L 23/49575; H01L 23/49513; H01L 23/49838; H01L 23/49555; H01L 23/49805

See application file for complete search history.

(56) References Cited

U.S. PATENT DOCUMENTS 5,157,475 A * 10/1992 Yamaguchi ............. H01L 21/56
257/679
7,709,935 B2 * 5/2010 Islam ...................... H01L 24/97
257/666

(Continued)

*Primary Examiner* — Shouxiang Hu
(74) *Attorney, Agent, or Firm* — Seed IP Law Group LLP

(57) ABSTRACT

The present disclosure is directed to leadless semiconductor packages with improved wettable flanks that encourage the formation of solder fillets when the leadless semiconductor package is mounted to a substrate. The solder fillets are consistently formed and are easily detectable by inspection systems, such as automated optical inspection (AOI) systems.

15 Claims, 12 Drawing Sheets

(51) Int. Cl.
*H01L 23/31* (2006.01)
*H01L 21/48* (2006.01)
*H01L 21/56* (2006.01)

(52) U.S. Cl.
CPC .............. *H01L 24/83* (2013.01); *H01L 24/85* (2013.01); *H01L 24/92* (2013.01); *H01L 24/97* (2013.01); *H01L 2224/32245* (2013.01); *H01L 2224/48091* (2013.01); *H01L 2224/48106* (2013.01); *H01L 2224/48245* (2013.01); *H01L 2224/73265* (2013.01); *H01L 2224/92247* (2013.01)

(56) References Cited

U.S. PATENT DOCUMENTS 10,121,742 B2 * 11/2018 Yeo ................... H01L 23/49503
10,153,424 B2 * 12/2018 Mizuta ................ H01L 21/568

* cited by examiner

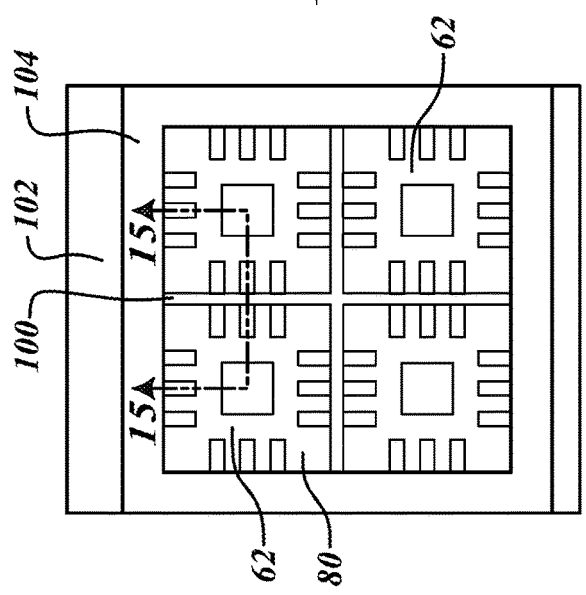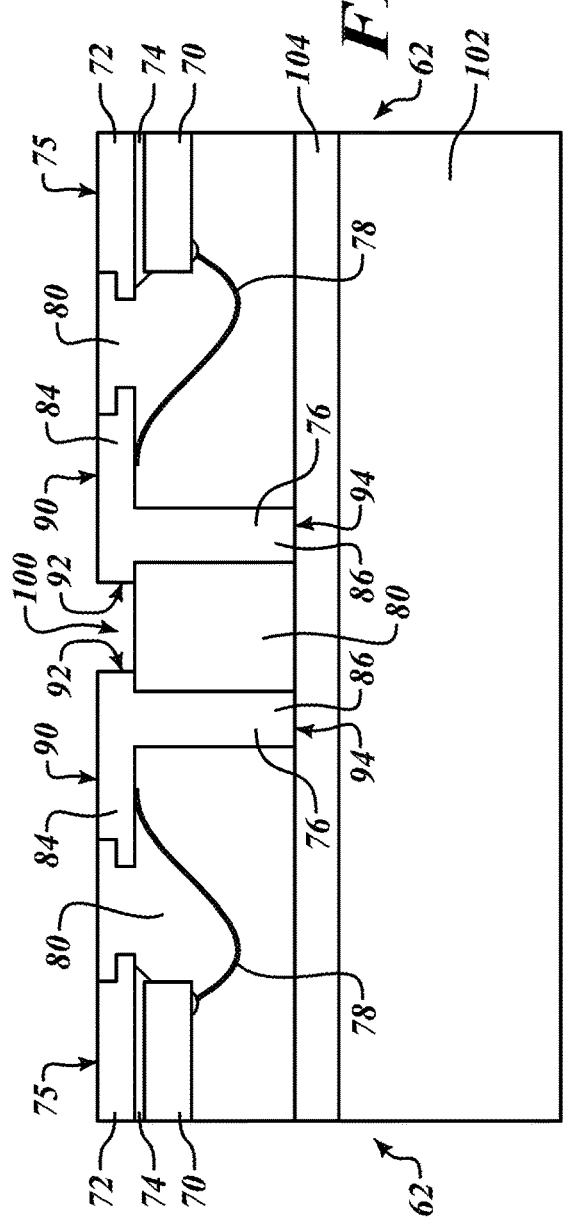

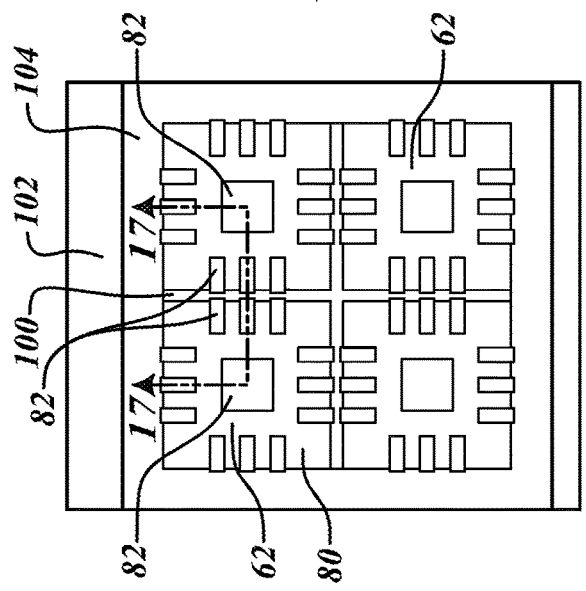
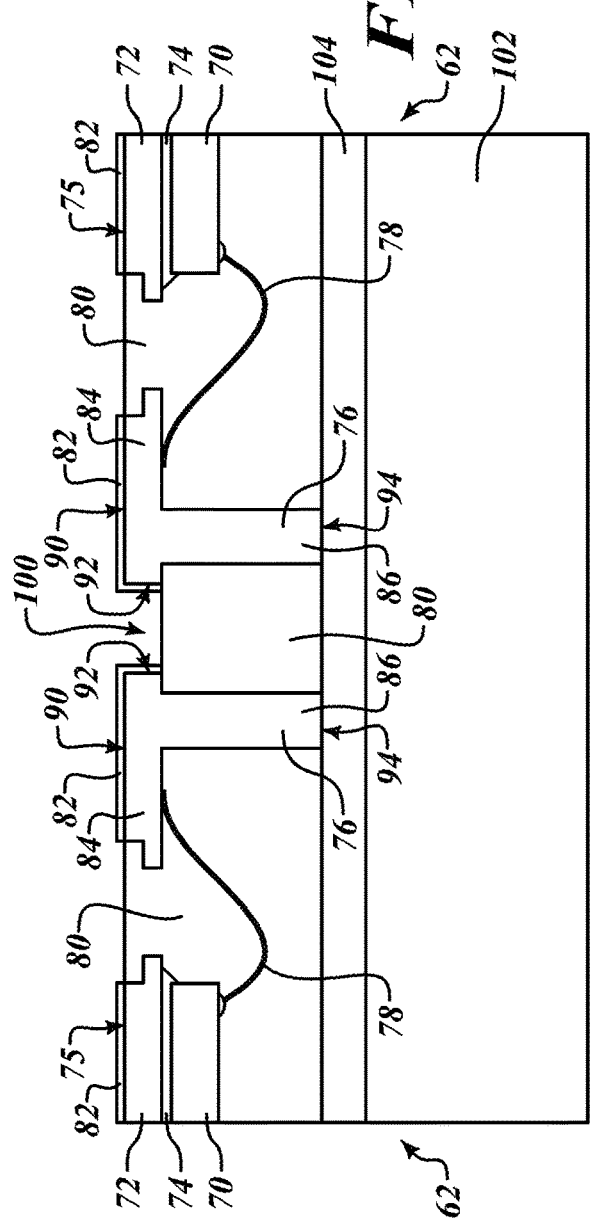

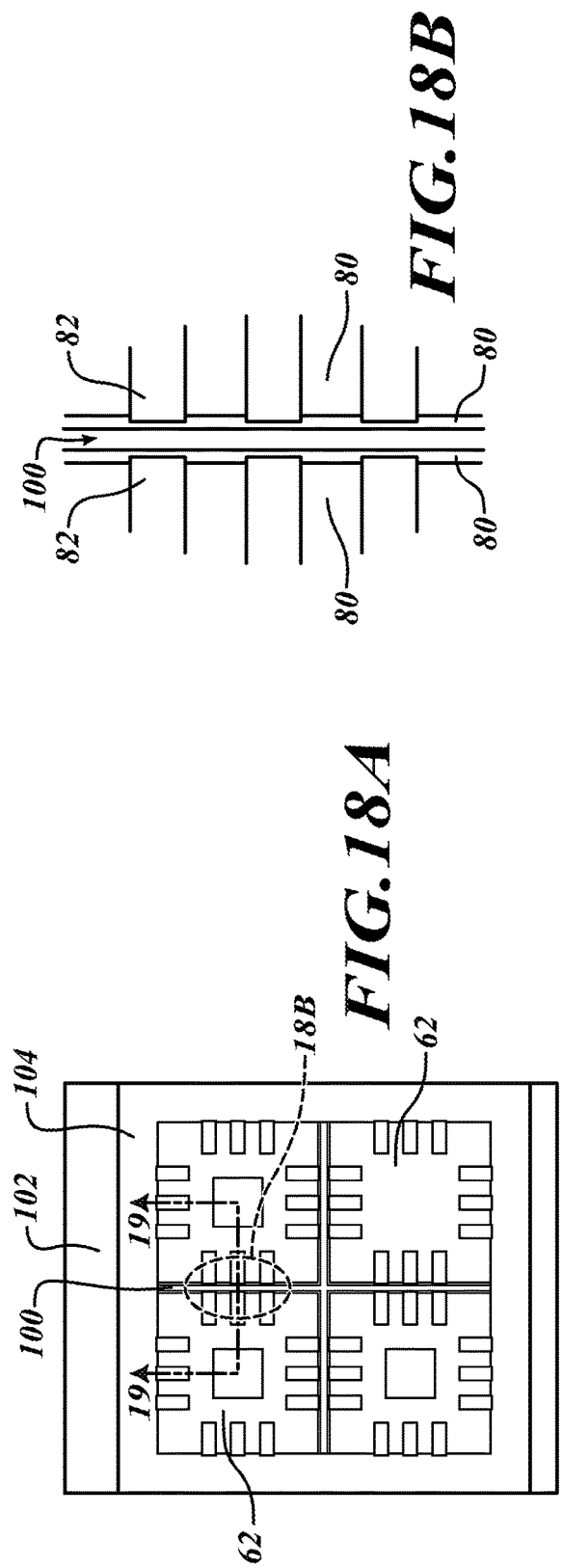
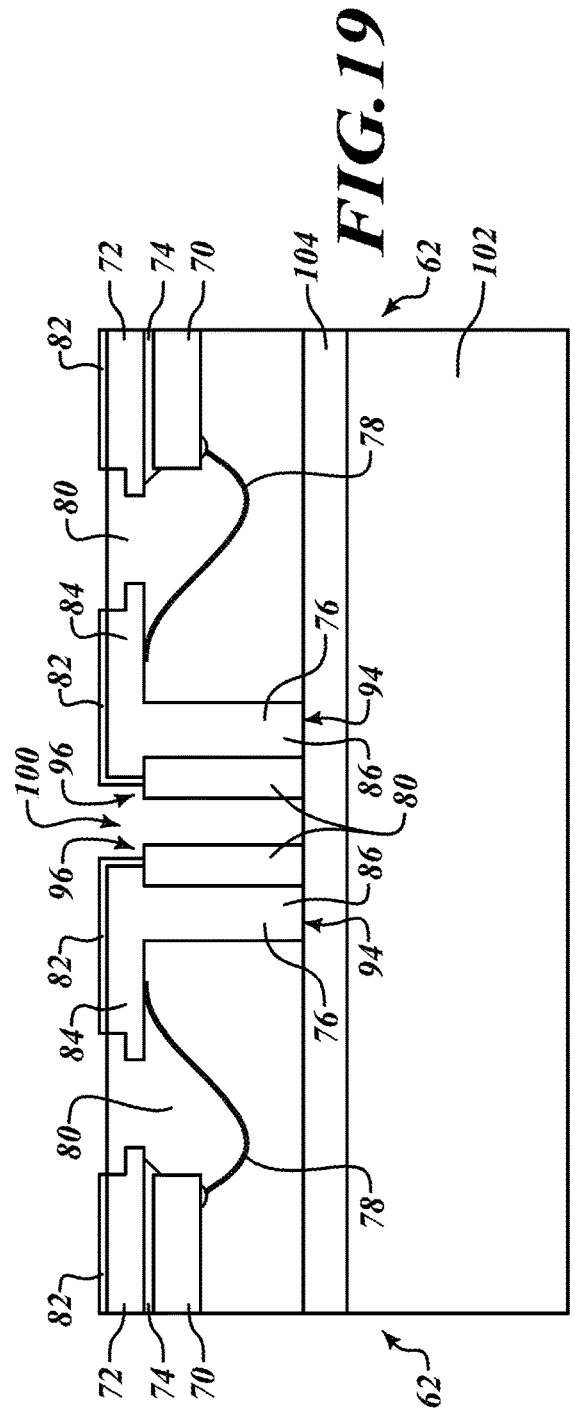

LEADLESS SEMICONDUCTOR PACKAGE WITH WETTABLE FLANKS

BACKGROUND

Technical Field

The present disclosure is directed to a leadless semiconductor package and a method for making the same.

Description of the Related Art

A leadless package is a semiconductor package that encapsulates one or more integrated circuits. Leadless packages have near chip scale footprints and thin profiles compared to other types of packages, and, thus, are commonly used for applications in which small packages are desired.

In contrast to a leaded package, a leadless package is not mounted to a substrate, such as a printed circuit board (PCB), by inserting metal legs in to through holes in the substrate. Rather, a leadless package includes leads (sometimes referred to as lands) that are exposed on a bottom surface and/or side surfaces of the leadless package, and is mounted to a substrate using surface mount technology (SMT). For example, a common method to mount a leadless package to a PCB is to solder the leads to contact pads on the PCB.

Once packages are mounted to a substrate, the mounted packages are often inspected to ensure that proper electrical connections have been made. For example, automated optical inspection (AOI) systems are often used to check solder joint terminations. Unfortunately, solder joints for many current leadless packages are not consistently formed such that the solder joints may be easily detected by AOI systems. For example, a singulated leadless package (e.g., QFNs), which has exposed leads on side surfaces of the package, often does not form solder joints that extend outward from package when mounted on a substrate. Consequently, the solder joints are not easily detected by AOI systems. Accordingly, current leadless packages are not suitable for high reliability applications in which solder joints should be checked by inspection systems, such as AOI systems, for proper electrical connections.

BRIEF SUMMARY

The present disclosure is directed to leadless semiconductor packages and methods for manufacturing the same. The leadless semiconductor packages include a plurality of leads, and conductive plating on the leads. The leads with the conductive plating are often referred to as wettable flanks. The conductive plating on the leads encourages the formation of solder. Namely, when the leadless semiconductor package is mounted to a substrate, such as a printed circuit board (PCB), solder formed on the conductive plating consistently extend outward from the leadless semiconductor package to form solder fillets. The conductive plating improves the formation of solder fillets by substantially covering the lower and side surfaces of the leads to prevent oxidation. In one embodiment, the conductive plating covers the entirety of the lower and side surfaces of the leads (i.e., 100% coverage) such the lower and side surfaces are not exposed to a surrounding environment. The conductive plating also improves the formation of solder fillets by having a large thickness (e.g., a thickness greater than 7 micrometers).

As the solder fillets extend outward from the leadless semiconductor package, solder joint terminations may be easily detected by inspection systems, such as automated optical inspection (AOI) systems. Accordingly, the leadless semiconductor packages are suitable for high reliability applications in which solder joints should be checked for proper electrical connections.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

FIGS. 10 to 19 are subsequent stages of manufacturing for fabricating the leadless semiconductor package of FIG. 9 according to one embodiment disclosed herein.

DETAILED DESCRIPTION

Figure 1:
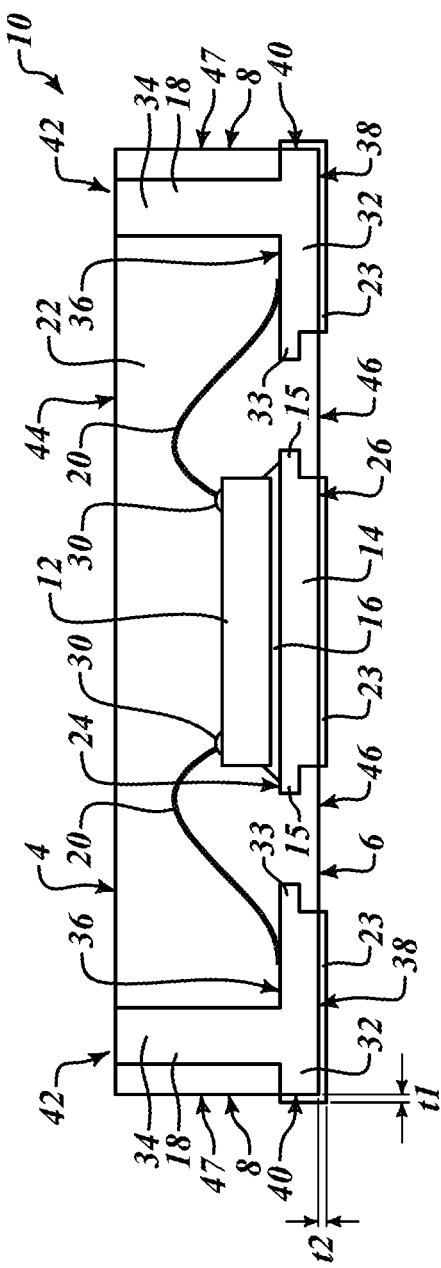
FIG. 1 is a cross-sectional view of a leadless semiconductor package according to one embodiment disclosed herein.

In the following description, certain specific details are set forth in order to provide a thorough understanding of various aspects of the disclosed subject matter. However, the disclosed subject matter may be practiced without these specific details. In some instances, well-known structures and methods of manufacturing electronic devices have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting or glass substrates, whether or not the components are coupled together into a circuit or able to be interconnected. Throughout the specification, the term "layer" is used in its broadest sense to include a thin film, a cap, or the like, and one layer may be composed of multiple sub-layers.

It is noted that the dimensions set forth herein are provided as examples. Other dimensions are envisioned for this embodiment and all other embodiments of this application.

Wettable flank technology is often used to encourage the formation of solder. In general, wettable flank technology includes forming a conductive layer on the leads of packages. Unfortunately, current leadless packages that utilize wettable flank technology do not consistently form solder that extends outward from the package. The portions of the solder that extends outward from the package are often referred to as solder fillets. Solder fillets may not form properly for a variety of reasons. For example, solder fillets may not form because portions of the leads are left uncovered by the conductive layer, and, thus, the leads oxidize. Solder fillets may also not form properly because the thickness of the conductive layer on the leads are too thin (e.g., less than 3 micrometers). A plating thickness greater than 7 micrometers is generally recommended to form proper solder fillets.

Without consistent formation of solder fillets, the solder joints are not easily detected by inspection systems, such as automated optical inspection (AOI) systems. Accordingly, current leadless packages are not suitable for high reliability applications in which each solder joint should be checked to ensure a proper electrical connection has been made.

The present disclosure is directed to leadless semiconductor packages and methods for manufacturing the same. The leadless semiconductor packages include a plurality of leads, and conductive layers on the leads. The conductive layers on the leads encourage the formation of solder. Namely, when the leadless semiconductor package is mounted to a substrate, such as a printed circuit board (PCB), solder formed on the conductive plating consistently extend outward from the leadless semiconductor package to form solder fillets. As the solder fillets extend outward from the leadless semiconductor package, solder joint terminations may be easily detected by inspection systems, such as AOI systems. Accordingly, the leadless semiconductor packages are suitable for high reliability applications in which each solder joint should be checked to ensure a proper electrical connection has been made.

FIG. 1 is a cross-sectional view of a leadless semiconductor package 10 according to one embodiment disclosed herein.

The leadless semiconductor package 10 has a first side 4, a second side 6 that is opposite to the first side 4, and third sides 8. The leadless semiconductor package 10 includes a silicon die 12, a pad 14, adhesive material 16, leads 18, wires 20, encapsulation material 22, and a conductive layer 23.

The silicon die 12 is a semiconductor die that includes one or more integrated circuits. The silicon die 12 may be any type of semiconductor die configured to send and/or receive electrical signals. For example, the silicon die 12 may be a processor, a sensor, a microelectromechanical system, or any other type of electronic chip that includes active (such as transistors) and passive circuitry.

The silicon die 12 is attached to the pad 14 by the adhesive material 16. An active surface, with connections to the wires 20 faces away from the adhesive material such that a passive, or inactive, surface of the die 12 is on or in the adhesive material. The pad 14 is a die pad that provides a platform for the silicon die 12. The pad 14 includes a first surface 24 and a second surface 26 that is opposite to the first surface 24. The silicon die 12 is attached to the first surface 24 of the pad 14. The second surface 26 of the pad 14 is left exposed by the encapsulation material 22 on the second side 6 of the leadless semiconductor package 10. In one embodiment, the pad 14 is made of a conductive material, such as copper or a copper alloy. As will be discussed in further detail below, the second surface 26 is covered by the conductive layer 23.

In one embodiment, the pad 14 includes a pad extension 15 that extends from the pad 14 toward the leads 18. The pad extension 15 increases the total surface area of the first surface 24. As a result, the pad 14 is able to accommodate larger dies.

The adhesive material 16 may be any type of material configured to couple the silicon die 12 to the pad 14. For example, the adhesive material 16 may be glue, epoxy, double-sided type, or any other type of adhesive.

The silicon die 12 is electrically coupled to the leads 18 by the wires 20. In particular, the wires 20 are electrically coupled between contact pads 30 of the silicon die 12 and the leads 18. A first end of the wires 20 is coupled to the contact pads 30 and a second end of the wires 20 is coupled to the leads 18. In one embodiment, the silicon die 12, the pad 14, the adhesive material 16, and the wires 20 are surrounded by the leads 18.

The leads 18 provide electrical signals from the silicon die 12 to an external component, such as a printed circuit board (PCB) and/or an electrical component (e.g., transistor, capacitor, resistor, etc.). In one embodiment, the leads 18 are made of a conductive material, such as metal, in particular, they could be copper or a copper alloy. Each of the leads 18 includes a first portion 32 and a second portion 34.

Each of the first portions 32 of the leads 18 includes a first surface 36, a second surface 38 that is opposite to the first surface 36, and a side surface 40. The first surface 36 receives the wires 20 and is covered by the encapsulation material 22. The second surface 38 is left exposed by the encapsulation material 22 on the second side 6 of the leadless semiconductor package 10. The side surface 40 is left exposed by the encapsulation material 22 on the third sides 8 of the leadless semiconductor package 10. As will be discussed in further detail below, the second surface 38 and the side surface 40 are covered by the conductive layer 23.

In one embodiment, the first portions 32 include lead extensions 33 that extend from the first portions 32 toward the pad 14. The lead extensions 33 increase the total surface area of the first surface 36. As a result, the leads 18 are able to provide a larger surface for the wires 20 to be coupled to.

The second portions 34 of the leads 18 are coupled to or otherwise extend from the first surface 36 of the first portions 32. The second portions 34 extend from the first surface 36 of the first portions 32 to the first side 4 of the leadless semiconductor package 10. The second portions 34 are posts or extensions of the first portions 32. Each of the second portions 34 include a surface 42 that is left exposed by the encapsulation material 22 on the first side 4 of the leadless semiconductor package 10. In one embodiment, the exposed surface 42 is used as a heatsink. As will be discussed in further detail with respect to FIGS. 3 and 4, the second portions 34 are exposed on the first side 4 of the leadless semiconductor package 10 to electrically couple the leads 18 to each other for an electroplating process.

Although the leads 18 are described herein as having first and second portions, the first portion 32 and the second portions 34 of each of the leads 18 may be a single contiguous piece.

Although only two leads are shown in FIG. 1, the leadless semiconductor package 10 may include any number of leads. For example, as will be discussed with respect to FIG.

3, the leadless semiconductor package 10 may include a plurality of leads on multiple sides of the leadless semiconductor package 10.

The encapsulation material 22 is formed over the silicon die 12, the pad 14, the adhesive material 16, the leads 18, and the wires 20. The encapsulation material 22 protects the leadless semiconductor package 10 from environmental sources of damage, such as physical damage, moisture, corrosion, or any other types of causes of damage. In one embodiment, the encapsulation material 22 is a molding compound that includes one or more of polyurethane, epoxy, acrylic, polymer, silicone, epoxy resin, or any other suitable material.

The encapsulation material 22 also provides outer planar surfaces to aid in mounting the leadless semiconductor package 10 to a substrate. The encapsulation material 22 forms a first surface 44 on the first side 4 of the leadless semiconductor package 10, a second surface 46 on the second side 6 of the leadless semiconductor package 10, and third surfaces 47 on the side 8 of the leadless semiconductor package 10. In one embodiment, the first surface 44 of the encapsulation material 22 is coplanar with the surfaces 42 of the leads 18. In one embodiment, the second surface 46 of the encapsulation material 22 is coplanar with the second surfaces 38 of the leads 18. In one embodiment, the third surfaces 47 of the encapsulation material 22 are coplanar with the side surface 40 of the leads 18.

The conductive layer 23 is formed on the exposed surfaces of the leads 18. Namely, the conductive layer 23 is formed on the second surfaces 38 and the side surfaces 40 of the first portions 32. The conductive layer 23 is also formed on the exposed surface of the pad 14. In particular, the conductive layer 23 is formed on the second surface 26. In one embodiment, the conductive layer 23 includes one or more of tin, gold, silver, nickel, and palladium. In one embodiment, as will be discussed in further detail with respect to FIGS. 2 to 7, the conductive layer 23 is formed on the leads 18 using an electroplating process.

The conductive layer 23 on the leads 18 encourages solder material to adhere to the leads 18 and improves the formation of solder. Namely, when the leadless semiconductor package 10 is mounted to a substrate, such as a printed circuit board (PCB), solder formed on the conductive layer 23 will consistently extend outward from the leadless semiconductor package 10. The portion of the solder that extends outward from the leadless semiconductor package 10 is often referred to as a solder fillet. As the solder fillets extend outward from the leadless semiconductor package, solder joint terminations are may be easily checked by inspection systems. For example, the solder fillets may easily be seen by visual systems, such as AOI systems. Accordingly, the leadless semiconductor package 10 is suitable for high reliability applications in which each solder joint termination should be checked to ensure a proper electrical connection has been made. The formation of solder fillets will be further discussed with respect to FIG. 8.

The conductive layer 23 improves the formation of solder fillets by substantially covering the surface of the second surfaces 38 and the side surfaces 40 of the first portions 32. In one embodiment, the conductive layer 23 covers the entirety of the second surfaces 38 and the side surfaces 40 of the first portions 32 (i.e., 100% coverage) such that the second surfaces 38 and the side surfaces 40 are not exposed to a surrounding environment. By substantially covering the second surfaces 38 and the side surfaces 40, the conductive layer 23 prevents the second surfaces 38 and the side surfaces 40 from oxidizing. The conductive layer 23 also improves the formation of solder fillets by having a large thickness (e.g., a thickness greater than 7 micrometers). A plating thickness greater than 7 micrometers is generally recommended to form solder fillets that are detected by AOI systems. In particular, a portion of the conductive layer on the side surfaces 40 has a thickness t1, and a portion of the conductive layer on the second surfaces 38 has a thickness t2. In one embodiment, each of the thickness t1 and the thickness t2 is greater than 7 micrometers. The formation of the solder fillets will be discussed in further detail with respect to FIG. 8.

FIGS. 2 to 7 are subsequent stages of manufacturing for fabricating the leadless semiconductor package 10 according to one embodiment disclosed herein.

Figure 2:
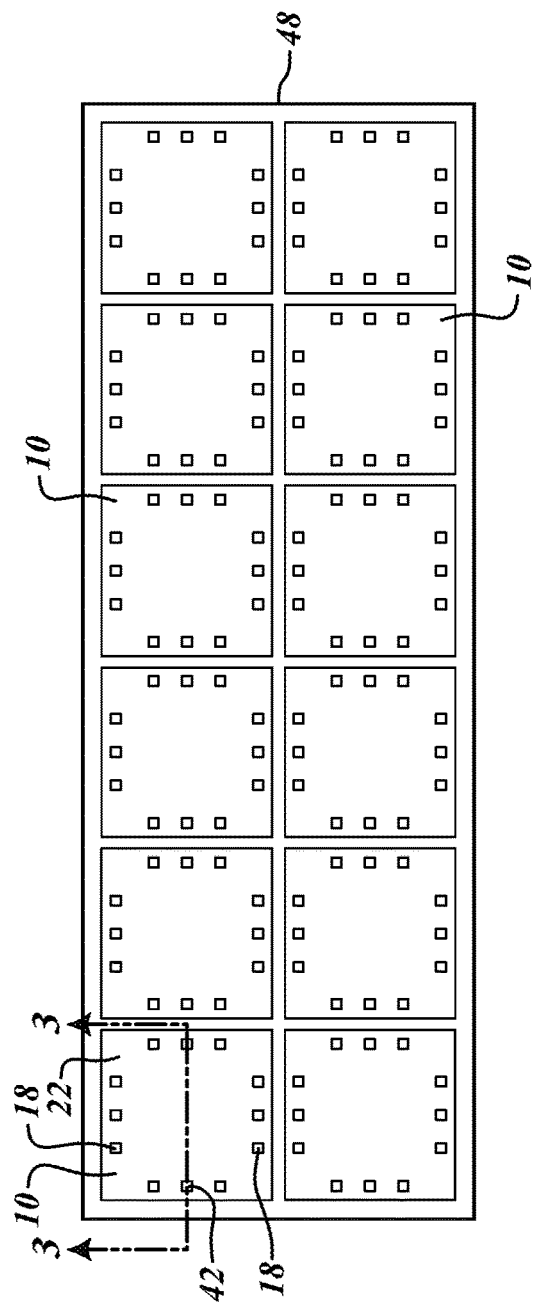
FIGS. 2 to 7 are subsequent stages of manufacturing for fabricating the leadless semiconductor package of FIG. 1 according to one embodiment disclosed herein.
Figure 3:
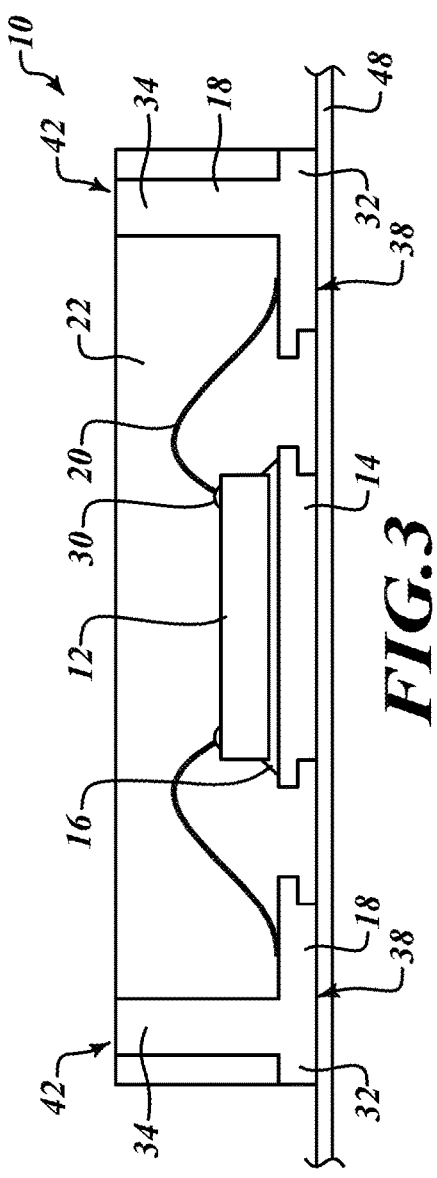

FIG. 2 is a plan view of a plurality of leadless semiconductor packages 10 according to one embodiment disclosed herein. FIG. 3 is a cross-sectional view of a single leadless semiconductor package 10 along the line 3-3 shown in FIG. 2 according to one embodiment disclosed herein. It is beneficial to review FIGS. 2 and 3 together. It is noted that, although 12 leadless semiconductor packages are shown in FIG. 2, any number of leadless semiconductor packages may be fabricated as disclosed herein.

The leadless semiconductor packages 10 shown in FIGS. 2 and 3 are after a wafer pre-assembly process, a frame fabrication process, a die attach process, a wire bond process, a molding process, and a full-cut singulation process have been performed.

In the wafer pre-assembly process, a plurality of silicon dies, including the silicon die 12, are fabricated. The silicon dies may be any type of semiconductor die configured to send and/or receive electrical signals. For example, as previously discussed, the silicon die 12 may be a processor, a sensor, a microelectromechanical system, or any other type of electronic chip.

In the frame fabrication process, the pad 14 and the leads 18, including the first portions 32 and the second portions 34, are formed. The pad 14 and the leads 18 may be formed using standard semiconductor processing techniques known or later developed. For example, the pad 14 and the leads 18 may be formed using pattern deposition or a combination of blanket deposition and etching.

It is noted that, although the surface 42 of the second portions 34 as shown in FIG. 2 have a square shape, other shapes are possible. For example, the second portions 34 may be cylindrical such that the surface 42 is circular from a top down view similar to FIG. 2.

In the die attach process, the silicon dies are attached to the pads 14 of respective leadless semiconductor packages. For example, the silicon die 12 is attached to the pad 14. In one embodiment, the silicon dies are attached to the pads by an adhesive material. For instance, as previously discussed, the silicon die 12 is attached to the pad 14 by the adhesive material 16.

In the wire bond process, the silicon dies are electrically coupled to leads of their respective leadless semiconductor packages. For example, the silicon die 12 is electrically coupled to the leads 18 by the wires 20. As previously discussed, the wires 20 are electrically coupled between contact pads 30 of the silicon die 12 and the leads 18.

In the molding process, encapsulation material is formed over the silicon dies, the pads, the adhesive material, the leads, and the wires. For instance, the encapsulation material 22 is formed over the silicon die 12, the pad 14, the adhesive material 16, the leads 18, and the wires 20. As previously discussed, in one embodiment, the encapsulation material 22 is a molding compound that includes one or more of polyurethane, epoxy, acrylic, polymer, silicone, epoxy resin, or any other suitable material.

In the full-cut singulation process, the leadless semiconductor packages are positioned on an adhesive layer 48 and separated into individual leadless semiconductor packages. The adhesive layer 48 holds the leadless semiconductor packages together while the leadless semiconductor packages are separated into individual pieces. In one embodiment, the adhesive layer 48 is UV tape. The leadless semiconductor packages may be separated using any type of singulation process. In one embodiment, the leadless semiconductor packages are separated by dicing.

Figure 4:
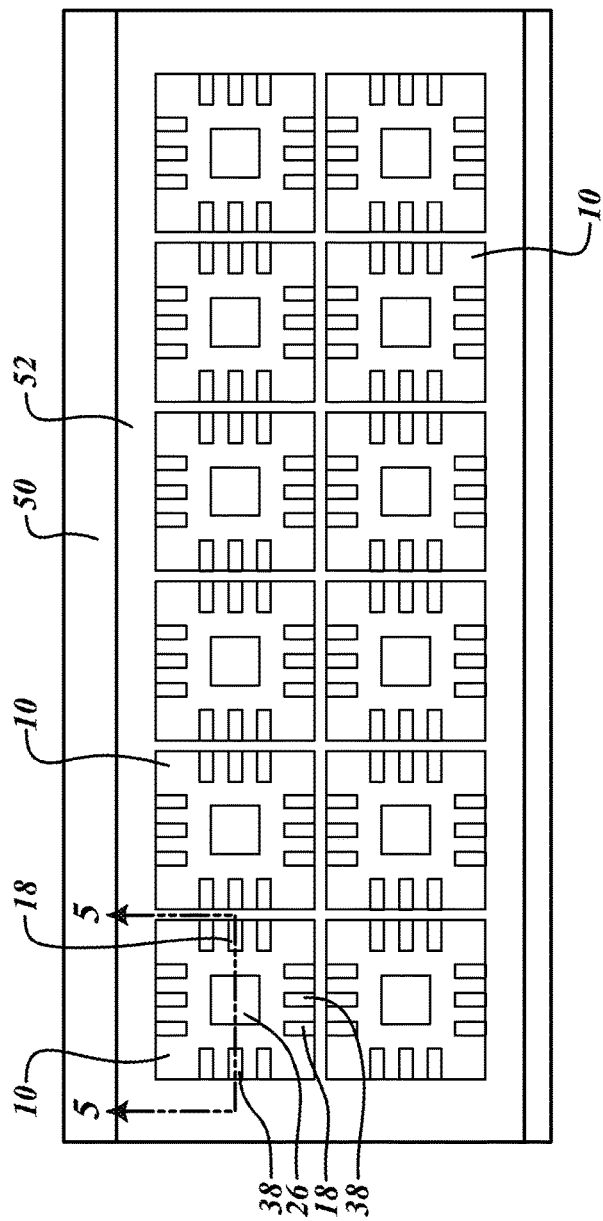
Figure 5:
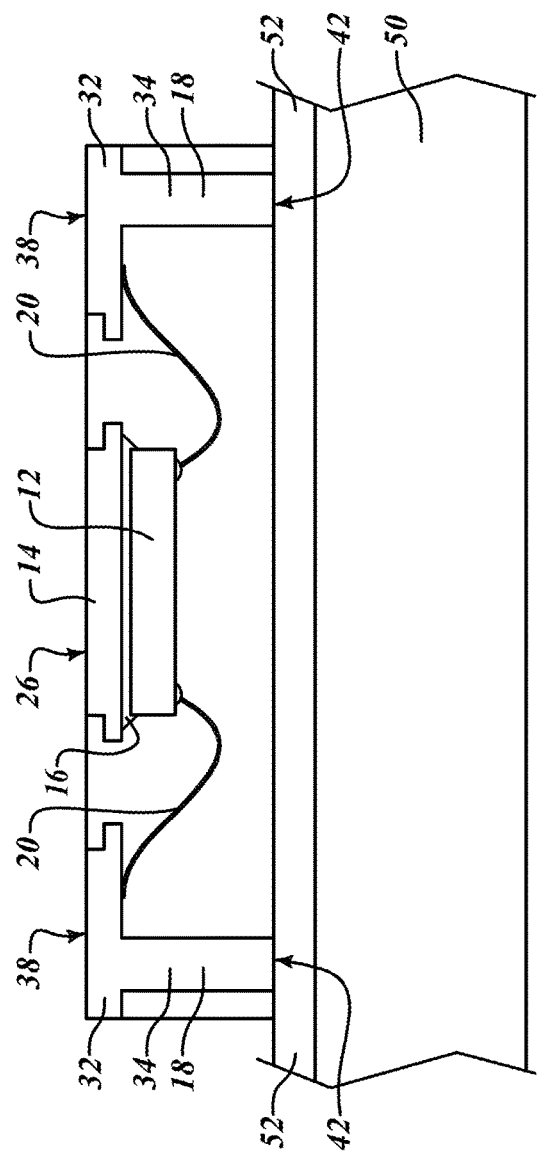

Subsequent to the full-cut singulation process, a pick-and-place process is performed. FIG. 4 is a plan view of the plurality of leadless semiconductor packages 10 after the pick-and-place process has been performed according to one embodiment disclosed herein. FIG. 5 is a cross-sectional view of the single leadless semiconductor package 10 along the line 5-5 shown in FIG. 4 according to one embodiment disclosed herein. It is beneficial to review FIGS. 4 and 5 together.

In the pick-and-place process, the plurality of the leadless semiconductor packages 10 are picked from the adhesive layer 48 and placed on a conductive plate 50 with the surfaces 42 of the second portions 34 of the leads 18 facing the conductive plate 50. Namely, the leadless semiconductor packages 10 are positioned on the conductive plate 50 such that the surface 42 of the second portions 34 of the leads 18 face the conductive plate 50. The conductive plate 50 may be made of any type of conductive material. In one embodiment, the conductive plate 50 is a steel plate.

The leadless semiconductor packages 10 are attached to the conductive plate 50 by a conductive adhesive 52. The conductive adhesive 52 may any type of adhesive that conducts electricity. In one embodiment, the conductive adhesive 52 is conductive tape.

By attaching the leadless semiconductor packages 10 to the conductive plate 50 with the conductive adhesive 52, the leads 18 of the plurality of the leadless semiconductor packages 10 are electrically coupled to each other. Namely, electricity may flow from a first lead, to the conductive adhesive 52, to the conductive plate 50, and to a second lead. Although not shown in FIG. 5, the pad 14 is also electrically coupled to the leads 18 of the plurality of the leadless semiconductor packages 10 via the conductive plate 50 and the conductive adhesive 52.

Figure 6:
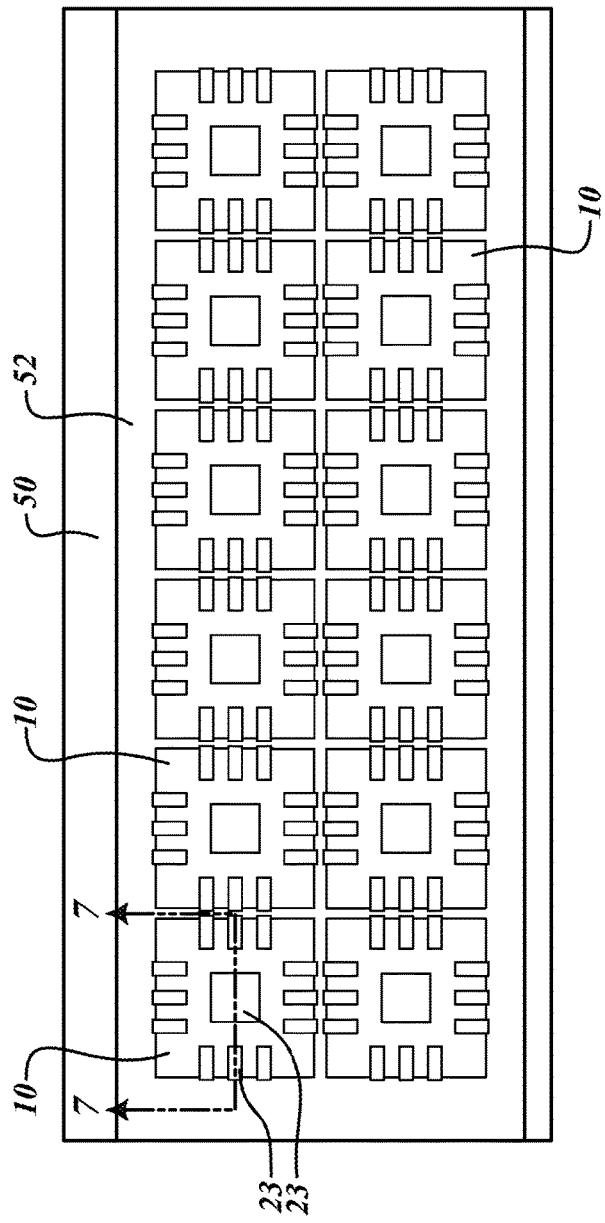
Figure 7:
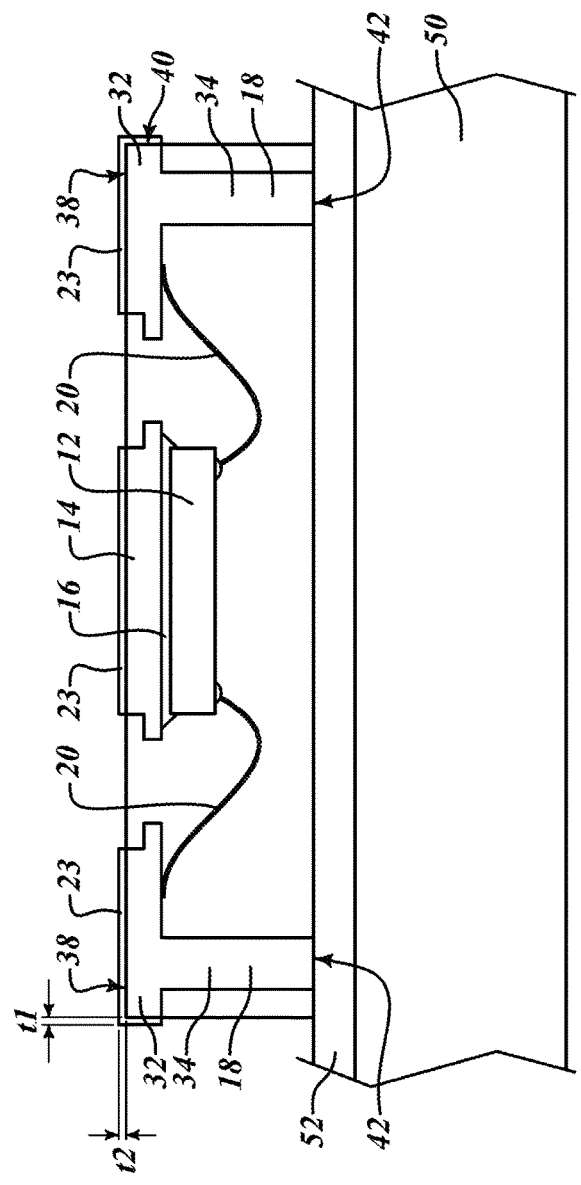

Subsequent to the pick-and-place process, an electroplating process is performed. FIG. 6 is a plan view of the plurality of leadless semiconductor packages 10 after the electroplating process has been performed according to one embodiment disclosed herein. FIG. 7 is a cross-sectional view of the single leadless semiconductor package 10 along the line 7-7 shown in FIG. 6 according to one embodiment disclosed herein. It is beneficial to review FIGS. 6 and 7 together.

In the electroplating process, the conductive layer 23 is formed on the pad 14 and the leads 18. As previously discussed, the conductive layer 23 is formed on the exposed surface of the pad 14; and on the second surfaces 38 and the side surfaces 40 of the first portions 32 of the leads 18. In one embodiment, as previously discussed, the conductive layer 23 includes one or more of tin, gold, silver, nickel, and palladium. It is noted that the electroplating process is possible because, as previously discussed, the pad 14 and the leads 18 of the plurality of the leadless semiconductor packages 10 are electrically coupled to each other via the conductive plate 50 and the conductive adhesive 52.

The electroplating process ensures that the second surfaces 38 and the side surfaces 40 of the first portions 32 are substantially covered by the conductive layer 23. As previously discussed, in one embodiment, the conductive layer 23 covers the entirety of the second surfaces 38 and the side surfaces 40 of the first portions 32 (i.e., 100% coverage) such that the second surfaces 38 and the side surfaces 40 are not exposed to a surrounding environment. In addition, as compared to other plating processes (e.g., immersion plating), the electroplating process ensures that the conductive layer 23 has a large thickness (e.g., a thickness greater than 7 micrometers). As previously discussed, in one embodiment, each of the thickness t1 and the thickness t2 is greater than 7 micrometers. As previously discussed, by substantially covering the exposed surfaces (i.e., the second surfaces 38 and the side surfaces 40) of the leads and having a large thickness, the conductive layer 23 improves the formation of solder fillets such that the solder joint terminations may be detected using AOI systems.

Once the electroplating process is complete, the conductive adhesive 52 is removed and the leadless semiconductor packages 10 are detached from the conductive plate 50. A cross-sectional view of a single leadless semiconductor package after being detached from the conductive plate 50 is shown in FIG. 1.

Figure 8:
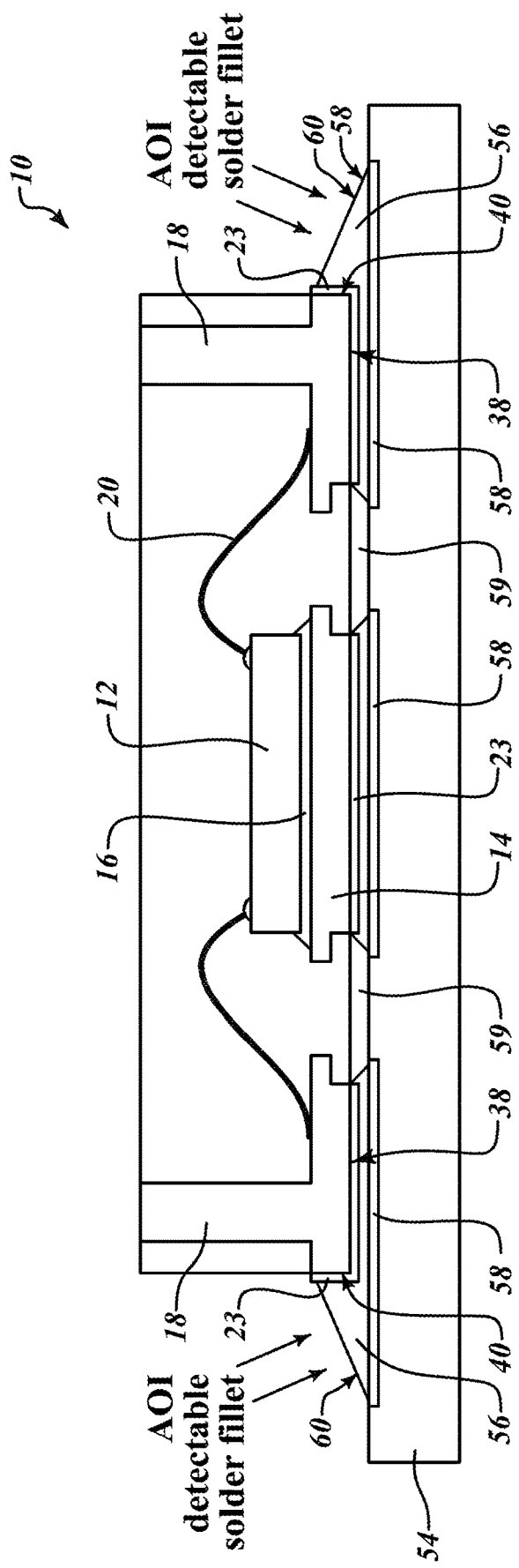
FIG. 8 is a cross-sectional view of the leadless semiconductor package of FIG. 1 mounted to a substrate according to one embodiment disclosed herein.

FIG. 8 is a cross-sectional view of the leadless semiconductor package 10 mounted to a substrate 54 according to one embodiment disclosed herein.

The leadless semiconductor package 10 is mounted to the substrate 54 by soldering the pad 14 and the leads 18 of the leadless semiconductor package 10 to contact pads 58 of the substrate 54. In one embodiment, for example, solder 56 is deposited on the contact pads 58. The leadless semiconductor package 10 is then placed on the solder 56 such that the solder 56 is formed between the conductive layer 23 and the contact pads 58 as shown in FIG. 8. In one embodiment, the leadless semiconductor package 10 is spaced from the substrate 54 by the solder 56 such that there is an air gap 59 between the leadless semiconductor package 10 and the substrate 54. In one embodiment, the substrate 54 is a PCB, such as one that will support a plurality of different chips and electronic devices.

As previously discussed, the conductive layer 23 improves the formation of solder fillets by substantially covering the exposed surfaces (i.e., the second surfaces 38 and the side surfaces 40) of the leads and by having a large thickness (e.g., a thickness greater than 7 micrometers). In particular, when the leadless semiconductor package 10 is mounted to the substrate 54, the solder 56 on the leads 18 will consistently extend outward from the leadless semiconductor package 10 to form solder fillets 60. As the solder fillets 60 extend outward from the leadless semiconductor package, solder joint terminations may be easily checked by inspection systems. For example, as shown in FIG. 8, the solder fillets 60 may easily be seen by visual systems, such as AOI systems. Accordingly, the leadless semiconductor package 10 is suitable for high reliability applications in which each solder joint termination should be checked to ensure a proper electrical connection has been made.

Figure 9:
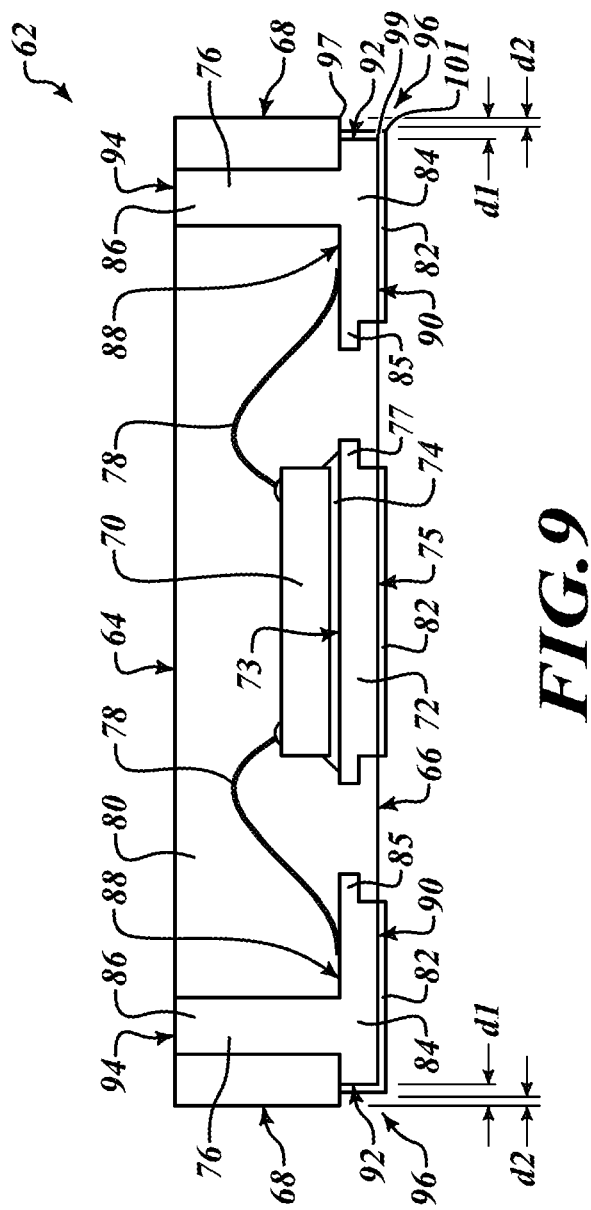
FIG. 9 is a cross-sectional view of a leadless semiconductor package according to another embodiment disclosed herein.

FIG. 9 is a cross-sectional view of a leadless semiconductor package 62 according to another embodiment disclosed herein. The leadless semiconductor package 62 is substantially similar to the leadless semiconductor package 10 shown in FIG. 1.

The leadless semiconductor package 62 has a first side 64, a second side 66 that is opposite to the first side 64, and third sides 68. The leadless semiconductor package 62 includes a silicon die 70, a pad 72, adhesive material 74, leads 76, wires 78, encapsulation material 80, and a conductive layer 82.

The pad 72 includes a first surface 73 and a second surface 75 that is opposite to the first surface 73. The silicon die 70 is attached to the first surface 73 of the pad 72 by the adhesive material 74.

In one embodiment, the pad 72 includes a pad extension 77 that extends from the pad 72 toward the leads 76. The pad extension 77 increases the total surface area of the first surface 73. As a result, the pad 72 is able to accommodate larger dies.

Each of the leads 76 includes a first portion 84 and a second portion 86. Each of the first portions 84 of the leads 76 includes a first surface 88, a second surface 90 that is opposite to the first surface 88, and a side surface 92. Each of the second portions 86 include a surface 94 that is left exposed by the encapsulation material 80 on the first side 64 of the leadless semiconductor package 62.

In one embodiment, the first portions 84 include lead extensions 85 that extend from the first portions 84 toward the pad 72. The lead extensions 85 increase the total surface area of the first surface 88. As a result, the leads 76 are able to provide a larger surface for the wires 78 to be coupled to.

The silicon die 70, the pad 72, the adhesive material 74, the leads 76, the wires 78, the encapsulation material 80, and the conductive layer 82 are substantially the same as the silicon die 12, the pad 14, the adhesive material 16, the leads 18, the wires 20, the encapsulation material 22, and the conductive layer 23, respectively, and, therefore, their descriptions will not be repeated here.

In contrast to the semiconductor package 10 shown in FIG. 1, the leadless semiconductor package 62 includes indentions 96. That is, the encapsulation material 80 extends past the side surfaces 92 of the leads 76 on the third sides 68 of the leadless semiconductor package 62 by a distance d1. In one embodiment, the distance d1 is between 10 and 20 micrometers. In addition, the encapsulation material 80 extends past the conductive layer 82 on the side surfaces 92 by a distance d2. In one embodiment, the distance d2 is between 5 and 10 micrometers. Said differently, an edge 97 of the encapsulation material 80 extends past or further from the silicon die 70 than an edge 99 of the lead 76 and an edge 101 of the conductive layer 82. As will be discussed in further detail with respect to FIGS. 10 to 19, the indentions 96 are formed by a pre-cut singulation process and a full-cut singulation process.

It is noted that, although the leadless semiconductor package 62 includes the indentions 96, the conductive layer 82 still substantially covers the second surfaces 90 and the side surfaces 92 of the leads 76. In addition, the conductive layer 82 still has a large thickness (e.g., a thickness greater than 7 micrometers). Accordingly, similar to the conductive layer 23 of the leadless semiconductor package 10, the conductive layer 82 encourages solder material to adhere to the leads 18 and improves the formation of solder fillets.

FIGS. 10 to 17 are subsequent stages of manufacturing for fabricating the leadless semiconductor package 62 according to one embodiment disclosed herein.

Figure 10:
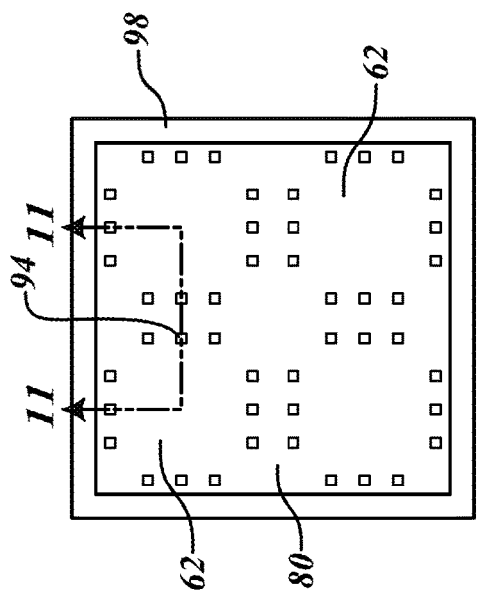
Figure 11:
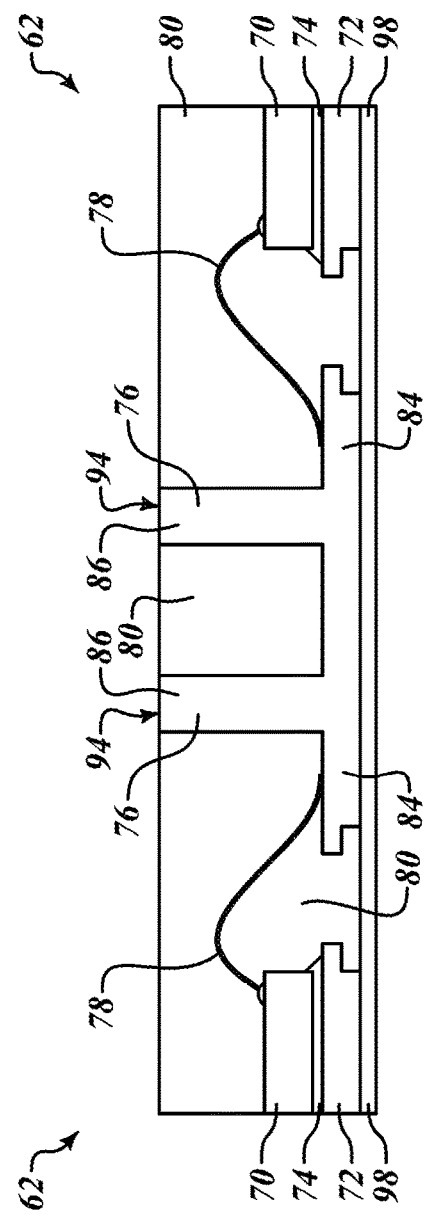

FIG. 10 is a plan view of a plurality of leadless semiconductor packages 62 according to one embodiment disclosed herein. FIG. 11 is a cross-sectional view between two adjacent leadless semiconductor packages 62 along the line 11-11 shown in FIG. 10 according to one embodiment disclosed herein. It is beneficial to review FIGS. 10 and 11 together. It is noted that, although four leadless semiconductor packages are shown in FIG. 10, any number of leadless semiconductor packages may be fabricated as disclosed herein.

Similar to FIGS. 2 and 3, the leadless semiconductor packages 62 shown in FIGS. 10 and 11 are after a wafer pre-assembly process, a frame fabrication process, a die attach process, a wire bond process, and a molding process. It is noted a full-cut singulation process has not been performed.

As previously discussed, in the wafer pre-assembly process, a plurality of silicon dies, including the silicon die 70, are fabricated.

In the die attach process, the silicon dies are attached to pads of respective leadless semiconductor packages. For example, the silicon dies 70 are attached to the pads 72. In one embodiment, the silicon dies are attached to the pads by an adhesive material. For instance, as previously discussed, the silicon die 70 are attached to the pads 72 by the adhesive material 74.

In the frame fabrication process, the pad 72 and the leads 76, including the first portions 84 and the second portions 86, are formed. The pad 72 and the leads 76 may be formed using standard semiconductor processing techniques known or later developed. For example, the pad 72 and the leads 76 may be formed using pattern deposition or a combination of blanket deposition and etching.

In the wire bond process, the silicon dies are electrically coupled to leads of their respective leadless semiconductor packages. For example, the silicon dies 70 are electrically coupled to the leads 76 by the wires 78.

In the molding process, encapsulation material is formed over the silicon dies, the pads, the adhesive material, the leads, and the wires. For instance, the encapsulation material 80 is formed over the silicon dies 70, the pads 72, the adhesive material 74, the leads 76, and the wires 78.

In one embodiment, the leadless semiconductor packages 62 are positioned on an adhesive layer 98. The adhesive layer 98 provides support for the leadless semiconductor packages 62 during the wafer pre-assembly process, the die attach process, the wire bond process, and the molding process. In one embodiment, the adhesive layer 48 is UV tape.

Figure 12:
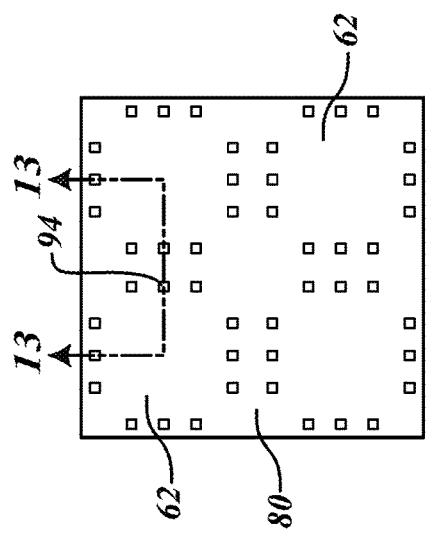
Figure 13:
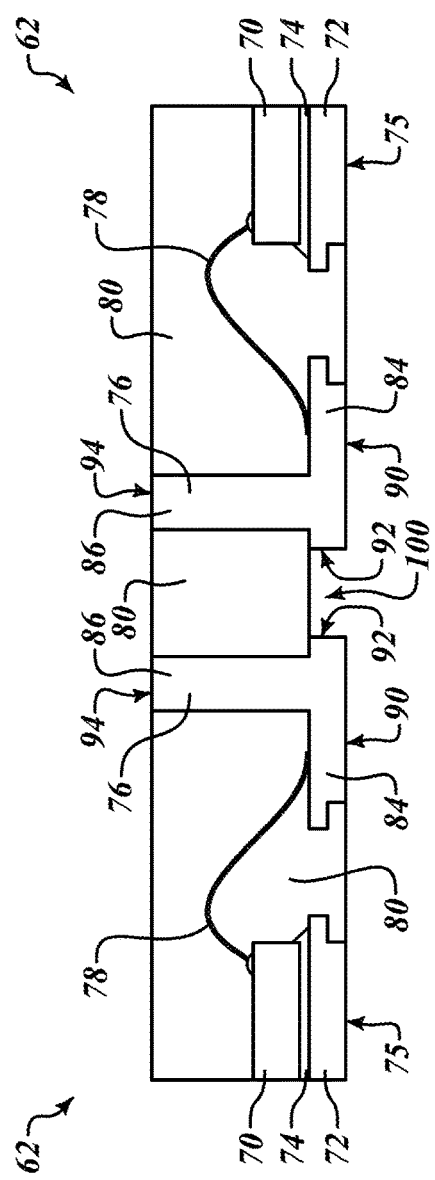

Subsequent to the molding process, a pre-cut singulation process is performed. FIG. 12 is a plan view of the plurality of leadless semiconductor packages 62 after the pre-cut singulation process has been performed according to one embodiment disclosed herein. FIG. 13 is a cross-sectional view between two adjacent leadless semiconductor packages 62 along the line 13-13 shown in FIG. 12 according to one embodiment disclosed herein. It is beneficial to review FIGS. 12 and 13 together.

In the pre-cut singulation process, the entire adhesive layer 98 is removed, and the leads 76 of adjacent leadless semiconductor packages are separated from each other. As best shown in FIG. 13, the leads 76 of adjacent leadless semiconductor packages are separated by removing portions of the leads 76 and forming a cavity 100.

Subsequent to the pre-cut singulation process, a strip transfer process is performed. FIG. 14 is a plan view of the plurality of leadless semiconductor packages 62 after the strip transfer process has been performed according to one embodiment disclosed herein. FIG. 15 is a cross-sectional view between two adjacent leadless semiconductor packages 62 along the line 15-15 shown in FIG. 14 according to one embodiment disclosed herein. It is beneficial to review FIGS. 14 and 15 together.

In strip transfer process, the plurality of leadless semiconductor packages 62 is turned over and transferred to a conductive plate 102 with the surface 94 of the second portions 86 of the leads 76 facing the conductive plate 102. The conductive plate 102 may be made of any type of conductive material. In one embodiment, the conductive plate 102 is a steel plate.

The leadless semiconductor packages 10 are attached to the conductive plate 102 by a conductive adhesive 104. The conductive adhesive 104 may any type of adhesive that conducts electricity. In one embodiment, the conductive adhesive 104 is conductive tape.

Similar to the pick-and-place process as discussed with respect to FIGS. 4 and 5, the leads 76 of the plurality of the leadless semiconductor packages 62 are electrically coupled to each other by being attached to the conductive plate 102 with the conductive adhesive 104. Namely, electricity may flow from a first lead, to the conductive adhesive 104, to the conductive plate 102, and to a second lead. Although not shown in FIG. 15, the pad 72 is also electrically coupled to the leads 76 of the plurality of the leadless semiconductor packages 62 via the conductive plate 102 and the conductive adhesive 104.

Subsequent to the strip transfer process, an electroplating process is performed. FIG. 16 is a plan view of the plurality of leadless semiconductor packages 62 after the electroplating process has been performed according to one embodiment disclosed herein. FIG. 17 is a cross-sectional view between two adjacent leadless semiconductor packages 62 along the line 17-17 shown in FIG. 16 according to one embodiment disclosed herein. It is beneficial to review FIGS. 16 and 17 together.

The electroplating process is similar to the electroplating process discussed with respect to FIGS. 6 and 7. As previously discussed, in the electroplating process, the conductive layer 82 is formed on the pad 72 and the leads 76. In particular, the conductive layer 82 is formed on the second surface 75 of the pad 72, and on the second surfaces 90 and the side surfaces 92 of the leads 76. It is noted that the electroplating process is possible because, as previously discussed, the pad 72 and the leads 76 of the plurality of the leadless semiconductor packages 10 are electrically coupled to each other via the conductive plate 102 and the conductive adhesive 104.

As previously discussed with respect to FIGS. 6 and 7, the electroplating process ensures that the second surfaces 90 and the side surfaces 92 of the leads 76 are substantially covered by the conductive layer 82. In addition, the electroplating process ensures that the conductive layer 23 has a large thickness (e.g., a thickness greater than 7 micrometers).

Subsequent to the electroplating process, a full-cut singulation process is performed. FIG. 18A is a plan view of the plurality of leadless semiconductor packages 62 after the full-cut singulation process has been performed according to one embodiment disclosed herein. FIG. 18B is an enlarged plan view of the circled area shown in FIG. 18A. FIG. 19 is a cross-sectional view between two adjacent leadless semiconductor packages 62 along the line 19-19 shown in FIG. 18 according to one embodiment disclosed herein. It is beneficial to review FIGS. 18 and 19 together.

In the full-cut singulation process, the leadless semiconductor packages 62 are separated into individual leadless semiconductor packages by removing portions of the encapsulation material 80. The conductive plate 102 and the conductive adhesive 104 holds the leadless semiconductor packages 62 together while the leadless semiconductor packages 62 are separated into individual pieces. The leadless semiconductor packages may be separated using any type of singulation process. In one embodiment, the leadless semiconductor packages are separated by dicing.

It is noted, as previously discussed with respect to FIG. 9, the pre-cut singulation process and the full-cut singulation process form the indentions 96 as discussed with respect to FIG. 9. That is, the encapsulation material 80 extends past the side surfaces 92 of the leads 76 on the third sides 68 of the leadless semiconductor package 62.

Once the full-cut singulation process is complete, the conductive adhesive 104 is removed and the leadless semiconductor packages 62 are detached from the conductive plate 102. A cross-sectional view of a single leadless semiconductor package after being detached from the conductive plate 102 is shown in FIG. 9.

Figure 20:
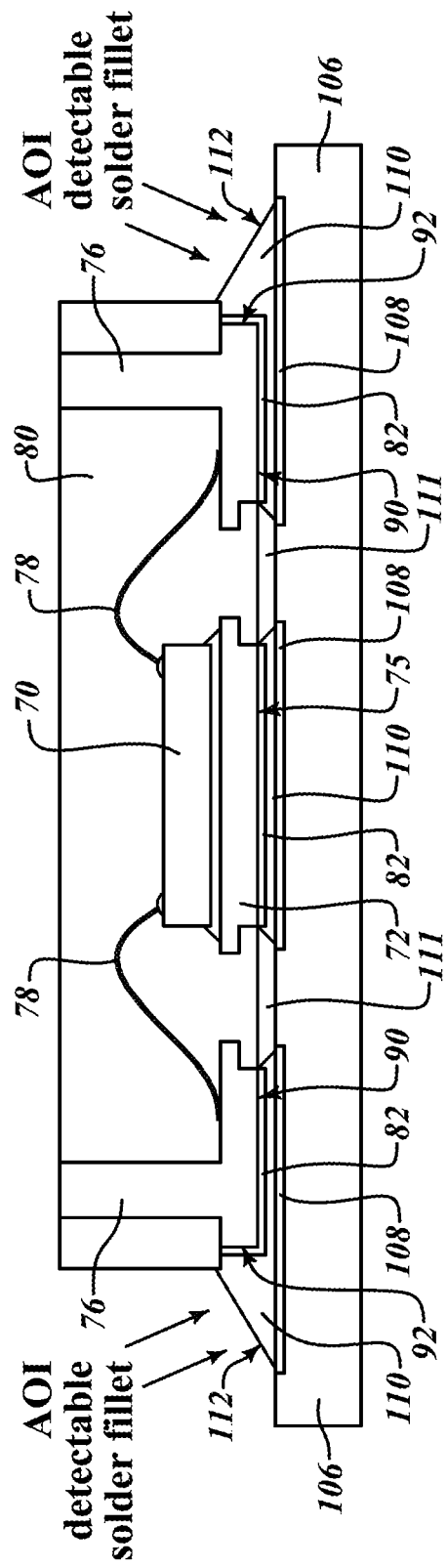
FIG. 20 is a cross-sectional view of the leadless semiconductor package of FIG. 9 mounted to a substrate according to one embodiment disclosed herein.

FIG. 20 is a cross-sectional view of the leadless semiconductor package 62 of FIG. 9 mounted to a substrate 106 according to one embodiment disclosed herein.

Similar to the leadless semiconductor package 10 as discussed with respect to FIG. 8, the leadless semiconductor package 62 is mounted to the substrate 106 by soldering the pad 72 and the leads 76 of the leadless semiconductor package 62 to contact pads 108 of the substrate 106. In one embodiment, for example, solder 110 is deposited on the contact pads 108. The leadless semiconductor package 62 is then placed on the solder 110 such that the solder 110 is formed between the conductive layer 82 and the contact pads 10 as shown in FIG. 20. In one embodiment, the leadless semiconductor package 62 is spaced from the substrate 106 by the solder 110 such that there is an air gap 111 between the leadless semiconductor package 62 and the substrate 106. In one embodiment, the substrate 106 is a PCB, such as one that will support a plurality of different chips and electronic devices.

As previously discussed, the conductive layer 82 improves the formation of solder fillets by substantially covering the exposed surfaces (i.e., the second surfaces 90 and the side surfaces 92) of the leads and by having a large thickness (e.g., a thickness greater than 7 micrometers). In particular, when the leadless semiconductor package 62 is mounted to the substrate 106, the solder 110 on the leads 76 will consistently extend outward from the leadless semiconductor package 62 to form solder fillets 112. As the solder fillets 112 extend outward from the leadless semiconductor package, solder joint terminations may be easily checked by inspection systems. For example, as shown in FIG. 20, the solder fillets 60 may easily be seen by visual systems, such as AOI systems. Accordingly, the leadless semiconductor package 62 is suitable for high reliability applications in which each solder joint termination should be checked to ensure a proper electrical connection has been made.

The various embodiments provide leadless semiconductor packages with improved wettable flanks that encourage the formation of solder fillets when the leadless semiconductor package is mounted to a substrate. The solder fillets are consistently formed and are easily detectable by AOI systems.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A package, comprising:
   encapsulation material including a first surface facing a first direction, a second surface facing a second direction opposite to the first direction, and a plurality of side surfaces;
   a die pad including a plurality of side surfaces;
   a plurality of conductive leads positioned laterally to the plurality of side surfaces of the die pad, each of the plurality of conductive leads including:
      a first portion including a first surface facing the first direction, a second surface facing the second direction, and a side surface, the first surface of the first portion being coplanar with the first surface of the encapsulation material, the first portion extending in a third direction transverse to the first and second directions; and
      a second portion including a surface that is coplanar with the second surface of the encapsulation material, the second portion extending from the second surface of the first portion toward the second surface of the encapsulation material, the second portion being spaced from one of the plurality of side surfaces of the encapsulation material by a portion of the encapsulation material, the portion of the encapsulation material extending away from the die pad and past the side surface of the first portion in the third direction; and
   a conductive layer on the first surface and the side surface of the first portion of each of the plurality of conductive leads.

2. The package of claim 1 wherein the plurality of conductive leads includes a first conductive lead and a second conductive lead, and the die pad is positioned between the first conductive lead and the second conductive lead.

3. The package of claim 1, further comprising:
   a die on the die pad and covered by the encapsulation material; and
   a plurality of wires that electrically couple the die to the plurality of conductive leads.

4. The package of claim 1 wherein the conductive layer has a thickness greater than 7 micrometers.

5. The package of claim 1 wherein the conductive layer covers the entire first surface and the entire side surface of the first portion of each of the plurality of conductive leads.

6. The package of claim 1 wherein the first surface of the first portion is coplanar with a surface of the die pad.

7. The package of claim 1 wherein the portion of the encapsulation material and the first portion form an indentation in the package.

8. The package of claim 1 wherein the portion of the encapsulation material extends away from the die pad and past a portion of the conductive layer that is on the side surface of the first portion.

9. A device, comprising:
   a package having a first side facing in a first direction, a second side facing in a second direction opposite to the first direction, and a third side facing in a third direction transverse to the first direction and the second direction, the package including:
      encapsulation material including a first surface facing the first direction, a second surface facing the second direction, and a third surface facing the third direction;
      a die pad;
      a conductive lead including:
         a first portion including a first surface on the first side of the package and facing the first direction, a second surface on the second side of the package and facing the second direction, and a third surface on the third side of the package and facing the third direction, the first surface of the first portion being coplanar with the first surface of the encapsulation material; and
         a second portion including a surface that is coplanar with the second surface of the encapsulation material, the second portion extending from the second surface of the first portion toward the second surface of the encapsulation material, the second portion being spaced from the third surface of the encapsulation material by a portion of the encapsulation material, the portion of the encapsulation material overhanging the third surface of the first portion;
      a conductive layer on the first surface and the third surface of the first portion.

10. The device of claim 9 wherein the conductive layer has a thickness greater than 7 micrometers.

11. The device of claim 9 wherein the conductive layer covers the entire first surface and the entire third surface.

12. The device of claim 9, further comprising:
   a die on the die pad;
   a wire that electrically couples the die and the conductive lead to each other.

13. A package, comprising:
   encapsulation material including a first surface, a second surface opposite to the first surface of the encapsulation material, and a plurality of side surfaces;
   a die pad in the encapsulation material;
   a plurality of leads, each of the plurality of leads including:
      a first portion including a first surface, a second surface opposite to the first surface of the first portion, and a side surface, the first surface of the first portion being coplanar with the first surface of the encapsulation material; and
      a second portion including a surface that is coplanar with the second surface of the encapsulation material, the second portion being spaced from one of the plurality of side surfaces of the encapsulation material, the one of the plurality of side surfaces of the encapsulation material being positioned further away from the die pad than the side surface of the first portion; and
   a conductive layer on the first and side surfaces of the first portion of each of the plurality of leads.

14. The package of claim 13 wherein the conductive layer has a thickness greater than 7 micrometers.

15. The package of claim 13 wherein the conductive layer covers the entire first and side surfaces of the first portion of each of the plurality of leads.

* * * * *